(12) United States Patent
Tanoi

(10) Patent No.: US 7,397,309 B2
(45) Date of Patent: Jul. 8, 2008

(54) BIAS CIRCUIT FOR A WIDEBAND AMPLIFIER DRIVEN WITH LOW VOLTAGE

(75) Inventor: Satoru Tanoi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 149 days.

(21) Appl. No.: 11/359,370

(22) Filed: Feb. 23, 2006

(65) Prior Publication Data

US 2006/0226910 A1 Oct. 12, 2006

(30) Foreign Application Priority Data

Mar. 24, 2005 (JP) ............................. 2005-085157

(51) Int. Cl.
*H03F 3/04* (2006.01)
(52) U.S. Cl. ...................... 330/296; 330/311
(58) Field of Classification Search ................ 330/253, 330/285, 296, 311, 277
See application file for complete search history.

(56) References Cited

U.S. PATENT DOCUMENTS 6,873,830 B2 * 3/2005 Katakura et al. ............ 330/296

6,977,553 B1 * 12/2005 Jin et al. ..................... 330/285

OTHER PUBLICATIONS

Thomas H. Lee, "The Design of CMOS Radio-Frequency Integrated Circuits", Cambridge University Press, pp. 164-166 and pp. 288-292, 1998.
Paul R. Gray and Robert G. Meyer, "Analysis and Design of Analog Integrated Circuits", Baifukan, Japan, pp. 286-289, Oct. 20, 2000.
Masamitsu Kawakami, "General Network Analysis I; Linear Constant (1)", Corona Publishing Co., Ltd., Japan, pp. 72-77.

* cited by examiner

*Primary Examiner*—Khanh V Nguyen
(74) *Attorney, Agent, or Firm*—Studebaker & Brackett PC; Donald R. Studebaker

(57) ABSTRACT

An amplifier includes a ground, first and second MOS transistors, a first resistive load and a supply voltage, which are connected in series in this order. A bias circuit provides first and second bias voltages to the gate electrodes of the first and second transistors, respectively. The bias circuit includes a third MOS transistor having its gate and drain electrode diode-connected. The drain electrode of the third transistor provides the first bias voltage of the amplifier. The bias circuit further includes fourth and fifth MOS transistors, and a second resistive load, which are connected in series in this order. The second resistive load is connected to the supply voltage. The fourth transistor has its gate electrode connected to the drain electrode of the third transistor. The fifth transistor has its gate and drain electrodes diode-connected. The drain electrode of the fifth transistor provides the second bias voltage.

4 Claims, 4 Drawing Sheets

BIAS CIRCUIT FOR A WIDEBAND AMPLIFIER DRIVEN WITH LOW VOLTAGE

BACKGROUND OF THE INVENTION

1. Field of the Invention

The present invention relates to a bias circuit for providing a bias voltage to a high-frequency amplifier. More specifically, the present invention relates to a bias circuit applicable to, for example, a so-called UWB (ultra wide band) amplifier, which requires operation in a wideband of 500 MHz or more.

2. Description of the Background Art

A conventional example of the high-frequency amplifier for use in a narrow band is disclosed in, for example, Thomas H. Lee, "The Design of CMOS Radio-Frequency Integrated Circuits," Cambridge University Press, Cambridge, pp. 164-166 and pp. 288-292, 1998. This reference shows, on pages 164-166, an example of a cascode type amplifier for improving high frequency characteristics, and, on pages 288-292, an example of an amplifier with exemplified device constants.

A conventional example of the high-frequency amplifier for use in a wide band is taught by, for example, Paul R. Gray, et al., "Analysis and Design of Analog Integrated Circuits," Baifukan, Japan, pp. 286-289, Oct. 20, 2000. The quality factor, which is an indicator for indicating the frequency selectivity of the high-frequency amplifier, is disclosed in, for example, Masamitsu Kawakami, "General Network Analysis I; Linear Constant (1)", Corona Publishing Co., Ltd., Japan, pp. 72-77, 1979.

The above-indicated amplifiers present, however, the following problems. The circuit disclosed by Thomas H. Lee is apparently for a narrowband operation. It is thus difficult for the circuit to provide a wide bandwidth operation of 500 MHz or more required by the UWB amplifiers. Providing the wideband operation needs the circuit taught by Paul R. Gray, et al. The circuit cannot perform, however, a stable amplification operation at a reduced supply voltage. More specifically, it is difficult for the conventional circuits to provide both of the amplification operation with a sufficiently high gain in the wideband and the amplification operation at a lower supply voltage.

SUMMARY OF THE INVENTION

It is an object of the present invention to provide a bias circuit for an amplifier attaining the amplification operation with a sufficiently high gain in the wideband at a lower supply voltage.

The present invention provides a bias circuit for an amplifier for providing a bias voltage to the amplifier comprising a ground, a first transistor, a second transistor, a first resistive load and a first supply voltage, which are connected in series in this order, wherein, in the amplifier, a first bias voltage is provided to the gate electrode or the base of the first transistor, and a second bias voltage is provided to the gate electrode or the base of the second transistor. The bias circuit comprises a third transistor having a gate electrode and a drain electrode, or a collector and a base, diode-connected. The drain electrode or collector of the third transistor provides the first bias voltage of the amplifier. The bias circuit further comprises a fourth transistor, a fifth transistor and a second resistive load which are connected in series in this order. The second resistive load is connected to the first supply. The fourth transistor has its gate electrode or base connected to the drain electrode or the collector of the third transistor. The gate electrode and the drain electrode, or the base and the collector, of the fifth transistor are diode-connected. The drain electrode or collector of the fifth transistor provides the second bias voltage.

The present invention provides a bias circuit for a differential type amplifier for providing a bias voltage to the amplifier comprising a ground, a first MOS transistor, a pair of second MOS transistors, a pair of first resistive loads and a first supply voltage, which are connected in series in this order, wherein one of the second transistors is connected in series to one of the first resistive loads, and the other of the second transistors is connected in series to the other of the first resistive loads. The second transistors have the source electrode or the emitter thereof connected to the first transistor. A first bias voltage is provided to the gate electrode or the base of the first transistor, and a second bias voltage is provided to the gate electrode or the base of each of the second transistors. The bias circuit comprises a third transistor having a gate electrode and a drain electrode, or a collector and a base, diode-connected. The drain electrode or collector of the third transistor provides the first bias voltage of the differential type amplifier. The bias circuit further comprises a fourth transistor, a fifth transistor and a second resistive load which are connected in series in this order. The second resistive load is connected to the first supply voltage. The fourth transistor has its gate electrode or base connected to the drain electrode or the collector of the third transistor. The fifth transistor has its gate and drain electrodes, or base and collector diode-connected. The drain electrode or collector of the fifth transistor provides the second bias voltage.

The bias circuit thus structured can provide a low voltage and low power consumption operation.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Referring now to accompanying drawings, embodiments of the bias circuit for an amplifier according to the present invention will be detailed below. Before the description of the embodiments of the present invention, for ease of understanding the present invention, a narrowband amplifier and a bias circuit for the amplifier and a wideband amplifier and a bias circuit for the amplifier will be described with reference to comparative examples shown in FIG. 2 and 3. The comparative example, the wideband amplifier, shown in FIG. 3 has a difficulty, compared to the present invention, in stable amplification operation at a lower supply voltage.

Figure 2:
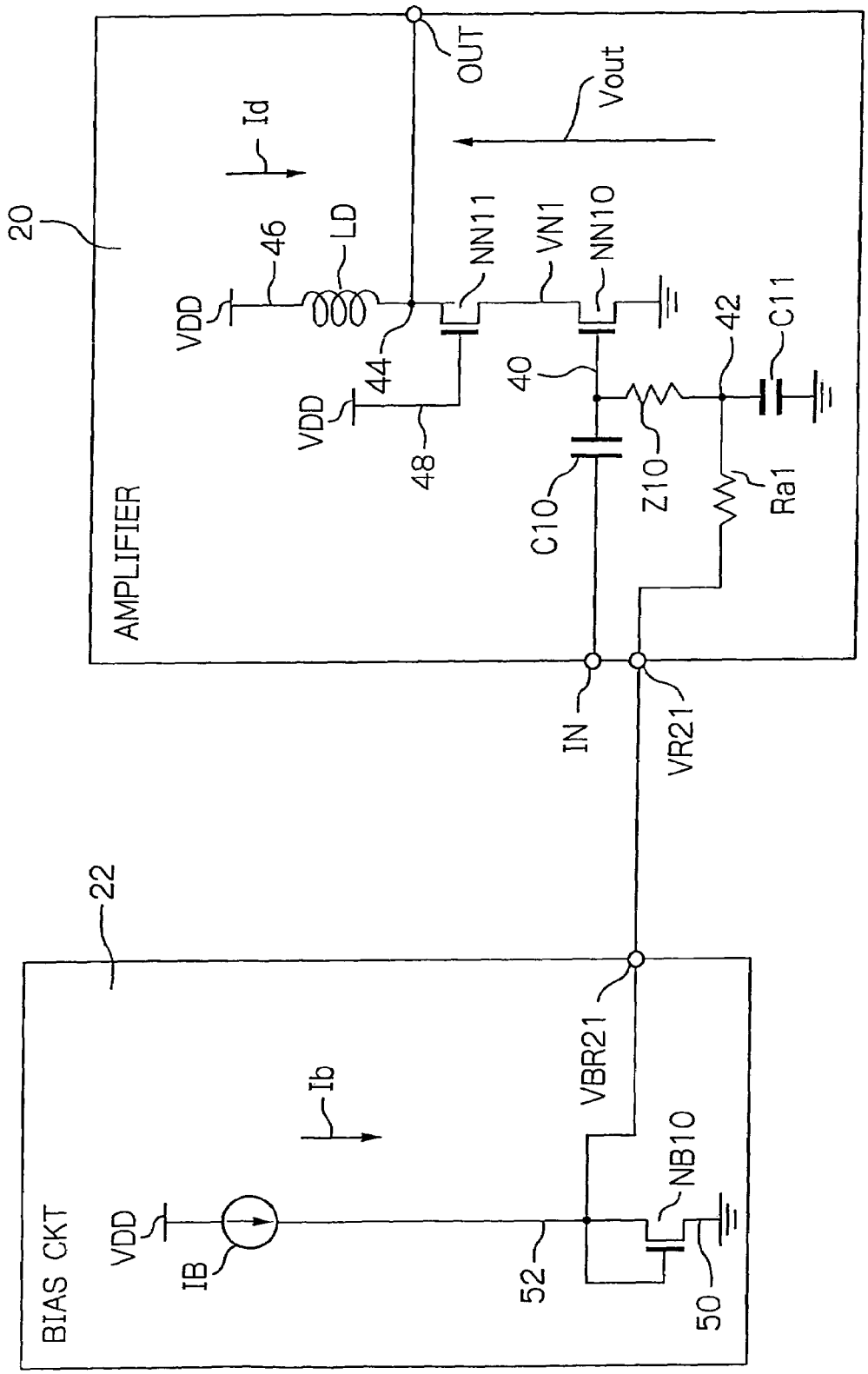
FIG. 2 is a schematic circuit diagram showing an example of an amplifier and a bias circuit for contrasting with the present invention.

FIG. 2 shows a cascode type of high-frequency amplifier for use in the narrowband as a comparative example. The high-frequency amplifier has an amplifier 20 and a bias circuit 22 which are interconnected as illustrated. The amplifier 20 includes, for example, a source-grounded N-channel type metal-oxide semiconductor (NMOS) transistor NN10, and an NMOS transistor NN11 connected in cascode with the NMOS transistor NN10.

The NMOS transistor NN10 has its gate electrode 40 connected to an input terminal IN of the amplifier 20 via a capacitor C10 which does not pass a DC component. The gate electrode also connects to one terminal of an impedance element Z10. The impedance element Z10 has its other terminal 42 grounded via a capacitor C11. The terminal 42 also connects to a bias voltage input terminal VR21 via a resistor Ra1.

The NMOS transistor NN10 has its drain electrode VN1 connected to the source electrode of the NMOS transistor NN11. The NMOS transistor NN11 has its drain electrode 44 connected to an output terminal OUT of the amplifier 20 and to one terminal of an inductor LD. The inductor LD has its other terminal 46 connected to a supply voltage terminal VDD which provides a supply voltage. The NMOS transistor NN11 has its gate electrode 48 connected to the supply voltage terminal VDD. Note that the supply voltage per se provided to the supply voltage terminal VDD will also hereinafter be referred to as VDD.

The bias circuit 22 includes, for example, an NMOS transistor NB10 and a current source IB. The NMOS transistor NB10 has its source electrode 50 grounded. The NMOS transistor NB10 has its gate and drain electrodes 52 connected in common to a bias voltage output terminal VBR21. The bias voltage output terminal VBR21 connects to the supply voltage terminal VDD via the current source IB. The bias voltage output terminal VBR21 of the bias circuit 22 also connects to the bias voltage input terminal VR21 of the amplifier 20.

The impedance element Z10 is adapted for impedance matching with the output from the circuit in its pre-stage. The impedance element Z10 may generally be a resistor of a few tens to a few hundred ohm. The impedance element Z10 may include an inductor. The capacitor C11 is selected to have its capacitance as large as a few pico-farads to provide a sufficiently low impedance in the operation bandwidth of the circuit. The resistor Ra1 is selected to have its resistance as large as a few kilo-ohms to provide a sufficiently high impedance.

A description will now be given on the operation of these circuits. The circuits amplify the AC component of the voltage signal given on the input terminal IN. The circuits then output the amplified voltage signal at the output terminal OUT. The inductor LD acts as a load of the amplifier 20. For an appropriate gain, both of the NMOS transistors NN10 and NN11 must be biased in such a way that they operate in the saturation region thereof.

The bias for the NMOS transistor NN10 will be first described. The DC component of the voltage applied to the gate electrode of the NMOS transistor NN10 equals the voltage on the bias voltage input terminal VR21. The NMOS transistor NB10 with the gate and drain electrodes connected in the bias circuit 22 generates the voltage on the bias voltage input terminal VR21. If each transistor is assumed to have the same gate length L, the following relation is attained:

$$WN10/WB10 = Id/Ib, \quad (1)$$

where symbols WB10, Ib, and WN10, Id represent the gate width of and the current flowing through the NMOS transistor NB10, and the gate width of and the current flowing through the NMOS transistor NN10, respectively. When a sufficiently high supply voltage is provided to the terminal VDD, the NMOS transistor NN10 can have its drain voltage VD1 which equals the drain voltage of the NMOS transistor NB10. The NMOS transistor NN10 can thus operate in its saturation region.

Regarding to the NMOS transistor NN11, its gate electrode is supplied with a voltage whose DC component equals the voltage on the supply voltage terminal VDD. The load inductor LD connected to the drain electrode of the NMOS transistor NN11 thus causes an extremely small DC voltage drop. More specifically, the drain and gate electrodes of the NMOS transistor NN11 are DC-coupled, thereby allowing the NMOS transistor NN11 to operate in its saturation region.

It is critical for such a circuit to be resistant to the device characteristics variations due to process variations and temperature changes or the like. For example, assume a slight increase in the threshold voltage Vt of the NMOS transistor NN10 in the amplifier shown in FIG. 2. It may then be expected that the same slight increase is causes in the threshold voltage Vt of the NMOS transistor NB10 in the bias circuit because the NMOS transistor NB10 is of the same type and has the same gate length as the NMOS transistor NB11. Therefore, even for a device characteristics variation, the current Id flowing through the amplifier can be maintained with respect to the current Ib flowing through the bias circuit, thereby providing a stable amplification operation.

Figure 3:
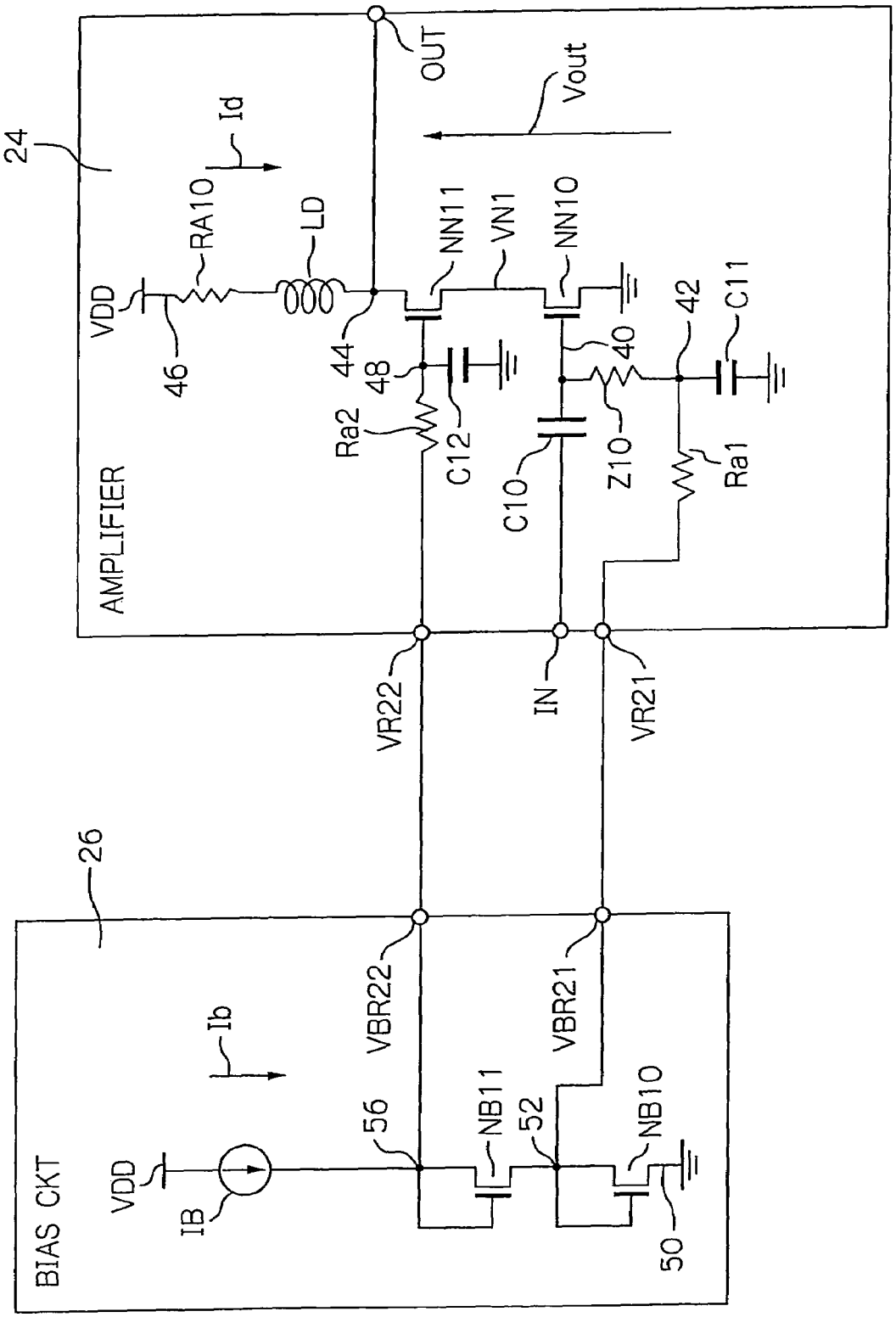
FIG. 3 is a schematic circuit diagram, similar to FIG. 2, of another example of an amplifier and a bias circuit for contrasting with the present invention.

A description will now be given on the wideband high-frequency amplifier as the other comparative example. FIG. 3 shows an example of the wideband high-frequency amplifier. The circuit includes an amplifier 24 and a bias circuit 26 which are interconnected as illustrated.

The amplifier 24 differs from the amplifier 20 depicted in FIG. 2 in that the load, implemented by the inductor LD with the FIG. 2 amplifier 20, is implemented by an inductor LD and a resistor RA10 which are connected in serial to each other. Like components are designated with the same reference numerals. For the NMOS transistor NN11 which connects through the load LD and the register RA10 to the output terminal OUT, its gate electrode 48 is grounded via a capacitor C12. The gate electrode 48 also connects to a bias voltage input terminal VR22 via a resistor Ra2. Note that the remaining elements in the amplifier 24 are of the same arrangement as those in the amplifier 20 shown in FIG. 2, so that their description will be omitted here with the same reference numerals provided for like elements.

The bias circuit 26 differs from the bias circuit 22 shown in FIG. 2 in that between the NMOS transistor NB10 and current source IB an NMOS transistor NB11 is provided which has its gate and drain electrodes 56 connected to each other The drain electrode 52 of NMOS transistor NB11 also connects to the bias voltage output terminal VBR22, which connects to the bias voltage input terminal VR22 of the amplifier 24.

A description will now be given on the operation of these circuits. The circuits amplify the alternating current component of the voltage signal given on the input terminal IN. The circuits then output the amplified voltage signal on the output terminal OUT. This comparative example differs in operation from the earlier-mentioned comparative example in that the inductor LD and resistor RA10 function as the load of the amplifier. The load has its resonance frequency $f_0$ due to a parasitic capacitive component which resides in parallel with the inductor LD and resistor RA10. The load impedance Zld provides the maximum value Zld0 at the resonance frequency $f_0$ because the load forms a parallel connection of inductor and capacitor. Assume that the frequencies at which the impedance drops by 3 dB with respect to the maximum value Zld0 are defined by fH and fL. If the difference therebetween is defined as Δf=fH−fL, then the following expression is established:

$$Q = f_0/\Delta f = (2\pi f_0 L d)/Ra10, \quad (2)$$

where the resistor RA10 and the inductor LD have the resistance Ra10 and the inductance Ld, respectively. The resonance frequency $f_0$ is the operational central frequency of the circuit. The circuit has its operational bandwidth Δf. The indicator Q is generally referred to as a quality factor, and indicates a frequency selectivity of the circuit or device. The above expression (2) is derived in a way detailed in the above-indicated Masamitsu Kawakami.

In the narrowband amplifier, the resonance frequency $f_0$ is generally set at the center of the operational frequency so as to improve its gain. The resistance Ra10 is desired to be as small as possible.

In the wideband amplifier, a larger resistance Ra10 needs to be set for a wider bandwidth Δf. As an example, when the inductance Ld is 2 to 4 nH, the resistance value Ra10 needs to be a few hundred ohm to provide a 1 GHz bandwidth around the central frequency of 4 GHz for a design rule with the gate length of about 0.2 μm.

Again, in the circuit of the comparative example of FIG. 3, for the appropriate gain, both of the NMOS transistors NN10 and NN11 must be biased in such a way that they are saturated, as in the comparative example of FIG. 2. The example of FIG. 3, however, applies to the NMOS transistor NN11 a bias different from that in the example of FIG. 2. As a result, the circuit 20 in the example of FIG. 3 has a voltage drop across the resistor RA10 of about a few hundred ohm in the load. A connection of the gate electrode 48 of the NMOS transistor NN11 to the supply voltage terminal VDD may cause a non-saturation condition depending on the amount of the drain current. An appropriate bias voltage thus needs to be applied to the gate electrode 48 of the NMOS transistor NN11.

A method of biasing for the cascode type circuit including a resistive load is to provide the bias voltage from voltage division by resistors. With the voltage division by resistors, the fluctuation and variation in resistors are independent from those in transistors, so that the circuit characteristics is sensitive to the temperature and supply voltage variations, and it is therefore impossible to increase the yield of the devices.

Another method, for a more stable operation, is the use of a bias circuit comprising a transistor to provide the bias voltage. This method is adapted here. According to FIG. 3, the gate electrode 48 of the NMOS transistor NN11 is coupled to the bias circuit 26. The drain electrode 44 of the NMOS transistor NB11 attains the bias voltage. Note that, because the biasing for the NMOS transistor NN10 is the same as the circuit shown in FIG. 2, the description thereon is omitted here.

It is assumed that each transistor has the same gate length L and the supply voltage terminal VDD provides a sufficiently high voltage. Then, the following expression is obtained, as in the example of FIG. 2:

$$WN10/WB10 = Id/Ib, \quad (3)$$

where symbols WB10, Ib, and WN10, Id represent the gate width of and the current flowing through the NMOS transistor NB10, and the gate width of and the current flowing through the NMOS transistor NN10, respectively. The expression (3) means that the NMOS transistor NN10 operates in its saturation region.

Because the NMOS transistor NB11 has the same source voltage as the NMOS transistor NN11, the following expression is obtained:

$$WN11/WB11 = Id/Ib, \quad (4)$$

where symbols WB11 and WN11 represent the gate width of the NMOS transistor NB11 and the gate width of the NMOS transistor NN11, respectively. It can also be concluded that the NMOS transistor NN11 has the same drain voltage VOUT as the NMOS transistor NB11 with respect to the DC component. Because the NMOS transistor NB11 operates in its saturation region, the NMOS transistor NN11 which has the same node voltages as the NMOS transistor NB11 also operates in its saturation region.

The amplifiers in the comparative examples have the following problems. The circuit shown in FIG. 2 is for the narrowband operation as apparent from the above description, and it is difficult for the circuit to provide the wide bandwidth of 500 MHz or more required for the UWB band.

For the wideband operation, the load needs a resistive component of a few hundred ohm or more, as described with respect to FIG. 3. There is a problem, however, that a circuit with the above resistance value cannot perform, for the following reason, the stable amplification operation at a reduced voltage on the supply voltage terminal VDD.

In the circuitry shown in FIG. 3, the drain-source voltages of the NMOS transistors NB10 and NB11 in the bias circuit 26 are higher than the threshold voltage Vt of the transistors NB10 and NB11. As mentioned above, the NMOS transistors NN10 and NN11 have the same node voltages as the NMOS transistors NB10 and NB11 in the bias circuit 26, respectively. The transistors NN10 and NN11 thus have the drain-source voltages thereof higher than the threshold voltage Vt.

The threshold voltage Vt is defined as the gate voltage at which the current flowing through the transistor decreases to a sufficiently low value, for example 0.1 microampere (μA) In the practical operation, however, a voltage about 1.5 times as high as the threshold voltage Vt must be applied to the source-drain passage of each transistor. This is for the purpose of allowing the drain current of a few milliampere (mA) to pass through the transistor for attaining a practical noise figure (NF) for each transistor. In other words, the DC voltage component of the voltage Vout on the output terminal OUT needs to be about three times as high as the threshold voltage Vt.

The resistor RA10 of about a few hundred ohm in the load will cause a DC voltage drop of about a few hundred mV. An enhancement type transistor with a low off-leak generally has its threshold voltage Vt equal to about 0.4 to 0.5V. This value is close to the voltage drop across the resistor RA10. In this circuit, therefore, a supply voltage about four times as high as the threshold voltage Vt needs to be provided to the supply voltage terminal VDD. That supply voltage is higher than that required for the narrowband amplifier. As described above, it is difficult for the circuit configuration of the comparative example of FIG. 3 to achieve the amplification operation with a sufficiently high gain both in the wideband and at a low supply voltage.

Figure 1:
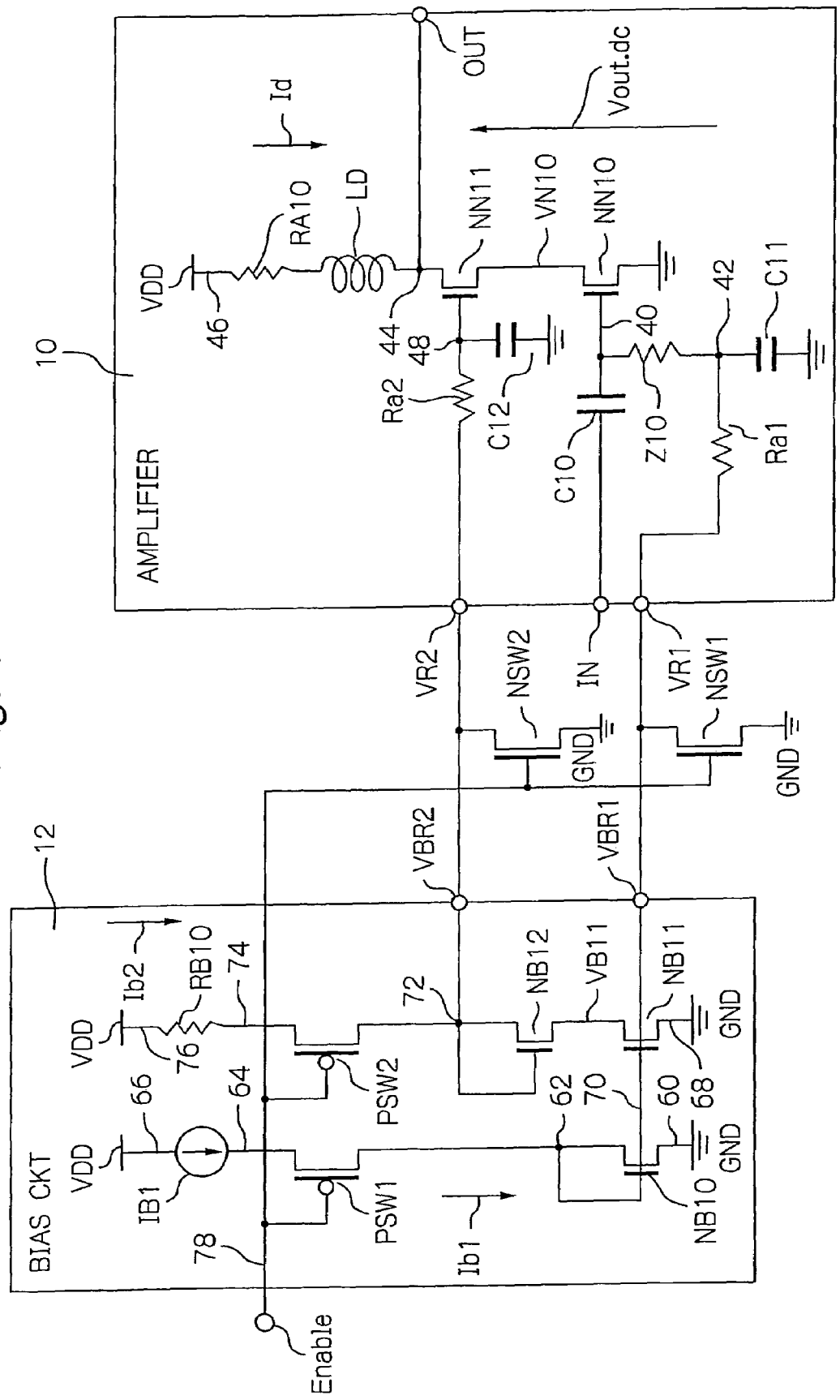
FIG. 1 is a schematic circuit diagram showing a preferred embodiment of an amplifier and a bias circuit according to the present invention.

A description will now be given on a preferred embodiment of the present invention which has solved the above-stated problems. FIG. 1 shows the illustrative embodiment of an amplifier and a bias circuit for the amplifier according to the present invention. The amplifier 10 is of a single-end type which includes one signal input terminal and one signal output terminal. The transistors involved are connected in cascode.

In more detail, the amplifier 10 includes a source-grounded NMOS transistor NN10, and an NMOS transistor NN11 connected in cascode with the NMOS transistor NN10. The illustrative embodiment is implemented by MOS transistors. However, the invention is also advantageously applicable to circuitry implemented by bipolar transistors. The NMOS transistor NN10 has its gate electrode 40 connected to an input terminal IN of the amplifier 10 via a capacitor C10 which does not pass the DC component of an input signal or voltage IN. Signals are designated with reference numerals or codes designating connections on which they are conveyed. The gate electrode 40 also connects to one terminal of an impedance element Z10. The impedance element Z10 has its other terminal 42 grounded via a capacitor C11. The terminal 42 also connects to a bias voltage input terminal VR21 via a resistor Ra1.

The NMOS transistor NN10 has its drain electrode VN10 connected to the source electrode of the NMOS transistor NN11. The NMOS transistor NN11 has its drain electrode 44 connected to the output terminal OUT of the amplifier 10 and to the load LD and RA10 of the amplifier 10. The NMOS transistor NN11 has its gate electrode 48 grounded via a capacitor C12. The gate electrode 48 also connects to the bias voltage input terminal VR2 via a resistor Ra2. The load of the amplifier 10 includes, for example, an inductor LD and a resistor RA10 which are connected in series to each other. The inductor LD has its one terminal 44 connected to the output terminal OUT. The resistor RA10 has its one terminal 46 connected to the supply voltage terminal VDD for supplying a source, or reference, voltage. This circuit also uses the resistor RA10 having its resistance equal to a few tens ohm to a few kilo-ohm, as in the example of FIG. 2.

With the instant embodiment, the bias circuit 12 includes the first bias circuit section for providing a voltage to the first bias voltage output terminal VBR1 as well as the second bias circuit section for providing a voltage to the second bias voltage output terminal VBR2. The first bias circuit section includes an NMOS transistor NB10 and a current source IB1 which are provided between the supply voltage terminal VDD and the ground GND, another reference voltage. The NMOS transistor NB10 has its source electrode 60 grounded. The NMOS transistor NB10 has its gate and drain electrodes 62 connected to the first bias voltage output terminal VBR1 and to one terminal 64 of the current source IB1 through a switch PSW1. Specifically, the gate and drain electrodes 62, connected in common to each other, are connected to the one terminal 64 of the current source IB1 via the switch PSW1 including a P-channel type MOS (PMOS) transistor. The current source IB1 has its other terminal 66 connected to the supply voltage terminal VDD.

The second bias circuit section includes NMOS transistors NB11 and NB12, and a resistor RB10 which are provided between the supply voltage terminal VDD and the ground GND. The NMOS transistor NB11 has its source electrode 68 grounded. The NMOS transistor NB11 also has its gate and drain electrodes 70 and VB11 connected to the bias voltage output terminal VBR1 and the source electrode of the NMOS transistor NB12, respectively. The NMOS transistor NB12 has its gate and drain electrodes 72 connected to one terminal 74 of the resistor RB10 through a switch PSW2 and to the second bias voltage output terminal VBR2. Specifically, the gate and drain electrodes 72, connected in common, are connected to the one terminal 74 of the resistor RB10 via the switch PSW2 including a PMOS transistor. The resistor RB10 has its other terminal 76 connected to the supply voltage terminal VDD.

The first and second bias voltage output terminals VBR1 and VBR2 are connected via switches NSW1 and NSW2, respectively, to the ground GND. The switches NSW1 and NSW2 each include an NMOS transistor, which has its gate electrode 78 connected in common to a control port "Enable". The switches NSW1 and NSW2 are adapted to cut off the current flowing to the amplifier 10 when no signals are input on the control port 78. The switches PSW1 and PSW2 are adapted to cut off the current flowing through the bias circuit 12 when disabled. This may prevent an unnecessary power consumption in the circuitry.

These switches connect to receive the enable signal "Enable" on the control port 78. The enable signal "Enable" is set to its high level, when the system is disabled, to cause the switches PSW1 and PSW2 to be non-conductive so that the bias circuit 12 carries no current. The high level also causes the switches NSW1 and NSW2 to be turned on to render the voltages on the first and second bias voltage input terminals VR1 and VR2 of the amplifier 10 to the reference level, i.e. 0V. The amplifier 10 thus carries no current also.

When the system is in its on state, the enable signal "Enable" is set to its low level. In turn, the switches PSW1 and PSW2 are turned on so that the bias circuit 12 carries a current. At the same time, the switches NSW1 and NSW2 are turned off, and the voltages on the first and second bias voltage input terminals VR1 and VR2 of the amplifier 10 are in turn set to predetermined bias levels. The amplifier 10 thus carries a current. This starts the amplification operation of the amplifier 10.

A description will now be made on the amplification and biasing operations of the circuits when the system is enabled. First, the amplifier 10 will be described. The amplifier 10 amplifies an AC component of the voltage signal given on the input terminal IN. The circuit 10 then outputs the amplified signal in the form of voltage signal on the output terminal OUT. The load of the amplifier 10 includes an inductor LD with an inductance L, and a resistor RA10 with a DC resistance Ra10, which are connected in series to each other. The amplifier 10 can thus perform a wideband amplification operation, as in the example of FIG. 3.

With a symbol Δf representing the operative bandwidth, the following expression is obtained:

$$\Delta f = Ra10/(2\pi L) \tag{5}$$

As an example, in an application with its central frequency of 4 GHz, the inductance L of 2 to 4 nH, and the DC resistance Ra10 of a few hundred ohm, a wide bandwidth of about 1 to 2 GHz can be accomplished.

Again, in this circuit 10, in order to provide an appropriate gain, the NMOS transistors NN10 and NN11 may preferably be biased in such a way that both of them are rendered saturated, as with the comparative example of FIG. 3. With the illustrative embodiment, the bias circuit 12, described below in detail, is used with the biasing points for the parameters of the amplifier 10 set in a fashion read as follows so as to accomplish the wideband amplification with the low-voltage power supply.

Description will be made with the operation of the bias circuit 12 and the bias point setting focussed. Here, symbols WB10, Ib1, WB11, WB12, Rb10, and Ib2 represent the gate width of and the current flowing through the NMOS transistor NB10, the gate width of the NMOS transistor NB11, the gate width of the NMOS transistor NB12, the resistance of the resistor RB10, and the current flowing through the NB11, NB12 and RB10, respectively. Furthermore, the indications WN10, WN11, Ra10, and Id represent the gate width of the NMOS transistor NN10, the gate width of the NMOS transistor NN11, the resistance of the resistor RA10, and the current flowing through the transistors NN10 and NN11 and resistor RA10, respectively. The transistors are assumed to have the same gate length L as each other.

With the illustrative embodiment, the parameters of the circuits are set in such a way that the voltages of the transistors in the amplifier 10 are rendered substantially equal to the voltages of the transistors corresponding thereto in the bias circuit 12. For example, the gate widths of the NMOS transistors may be set as follows:

$$WB10:WB11:WN10=1:1:k, \qquad (6)$$

$$WB12:WN11=1:k. \qquad (7)$$

If the supply voltage terminal VDD is assumed to provide a sufficiently high voltage, the NMOS transistors NB10, NB11, and NN10 are saturated, and the bias currents Ib1, Ib2 and Id satisfy the following relation:

$$Ib1:Ib2:Id=1:1:k. \qquad (8)$$

The NMOS transistor NN10 has its drain voltage VN10 equal to the drain voltage VB11 of the NMOS transistor NB11. Specifically, $$VN10=VB11. \qquad (9)$$

This is caused by the two transistors having the same gate voltage, the same drain-current ratio, and the same gate-width ratio. If the resistances are set as $$Rb10:Ra10=k:1, \qquad (10)$$

then, the drain voltage VBR2 of the NMOS transistor NB12 is as follows, $$VBR2=VDD-Rb10 \times Ib2=VDD-k \times Ra10 \times Ib2. \qquad (11)$$

The DC component of the drain voltage of the NMOS transistor NN11, i.e., the drain voltage Vout.dc, is as follows:

$$Vout.dc=VDD-Ra10 \times Id=VDD-Ra10 \times k \times Ib2=VBR2. \qquad (12)$$

In other words, the DC component of the drain voltage of the NMOS transistor NN11 equals the drain voltage of the NMOS transistor NB12. Specifically, $$Vout.dc=VBR2. \qquad (13)$$

According to the expression (9), the source voltage VN10 of the NMOS transistor NN11 substantially equals the source voltage VB11 of the NMOS transistor NB12. Furthermore, the gate electrodes 48 and 72 of the NMOS transistors NN11 and NB12 are coupled via the resistor Ra2 to each other, so that the gate voltages of the NMOS transistors NN11 and NB12 have the same DC component. The NMOS transistor NB12 has its gate and drain electrodes 72 coupled to each other so as to function as a diode. In the following, such a connection may sometimes be simply referred to as diode-connected. The NMOS transistor NB12 thus operates in its saturated region. As described above, the node voltages of the NMOS transistor NB12 are equal in the DC component to the corresponding node voltages of the NMOS transistor NN11. The NMOS transistor NN11 thus also operates in its saturated region. In this way, the use of the bias circuit 12 and the setting of the operational points as described above allows the transistors in the amplifier 10 to operate in the saturation regions thereof, thereby functioning as a wideband amplifier.

A description will further be given on the capability of the circuitry of the illustrative embodiment to accomplish the stable amplification even with the supply voltage VDD lower than that in the comparative example of FIG. 3. According to the expressions (9) and (13), the NMOS transistor NN11 has its drain-source voltage substantially equal to that of the NMOS transistor NB12. Because of the NMOS transistor NB12 acting as a diode, its drain-source voltage is equal to or more than the threshold voltage Vt of the transistor NB12. The drain-source voltage of the NMOS transistor NN11, therefore, needs to be equal to at least the threshold voltage Vt. Taking into account the required drain current, the drain-source voltage of the NMOS transistor NN11 is about 1.5 times as high as the threshold voltage Vt.

Well, the transistor NN10 will be described. In operation, the transistor NN10 has its drain-source voltage substantially equal to that of the NMOS transistor NB11, as described above. The saturation of the NMOS transistor NB11, therefore, ensures the saturation of the NMOS transistor NN10 also. The NMOS transistor NB11 saturates under the condition as follows:

$$VBR1-Vt \leq B11(=VN10). \qquad (14)$$

Taking into account the NMOS transistor NB10 which provides the voltage VBR1 functioning as a diode to conduct a predetermined current flowing therethrough, the voltage VBR1 is about 1.5 times as high as the threshold voltage Vt, and the voltage VB11 can be about half the threshold voltage Vt. Note that the NMOS transistor NB11 is not diode-connected so that the transistor NB11 can operate in its saturated region even at the drain-source voltage lower than the threshold voltage Vt.

The drain-source voltage of the NMOS transistor NN10 may, therefore, be about 0.5 times as high as the threshold voltage Vt. For the amplification operation in a few GHz as in the comparative example of FIG. 2, the resistor RA10 may be of about a few hundred Ω and the current Id may be a few mA, for example. The voltage drop across the resistor RA10 is then about a few hundred milli-volt, which is almost equal to the threshold voltage Vt. Consequently, the supply voltage VDD necessary for the operation may be about three times as high as the threshold voltage Vt.

Under the same operation condition, the circuit in the comparative example of FIG. 3 requires a voltage which is about four times as high as the threshold voltage Vt. It is thus apparent that the circuitry of the illustrative embodiment can decrease the voltage of the power supply. A wider bandwidth and better NF characteristics need a larger current Id. This causes the difference to increase between the required supply voltages in the illustrative embodiment and the comparative example of FIG. 3, as apparent from the above discussion.

As described above, the illustrative embodiment can provide the wideband amplification operation even at the supply voltage lower than that in the comparative example of FIG. 3. Furthermore, the circuitry of the preferred embodiment can provide the wideband amplification for the low-voltage power supply even for some process variations and temperature changes or the like, as will be described below. Assume, for example, a slight increase in the threshold voltages Vt of the NMOS transistors NN10 and NN11. The same amount of slight increase may be expected in the threshold voltage Vt of the NMOS transistors NB10, NB11 and NB12 in the bias circuit because the NMOS transistors NB10, NB11 and NB12 are of the same type and have the same gate length as the transistors NN10 and NN11. The result is that the current through the amplifier 10 may remain at the target value Id with respect to the currents Ib1 and Ib2 through the bias circuit 12.

The reason reads as follows. Under the condition that a slight increase occurs in the threshold voltage Vt of the NMOS transistors in the amplifier 12, the current equal to the target value Id can flow through the NMOS transistors NN10 and NN11 provided that the gate-source voltage of these transistors becomes larger by the corresponding slight increase in the threshold voltage Vt. The NMOS transistors NB10 and NB12 each increase the drain-source voltage by the amount corresponding to the slight increase in their threshold voltages Vt. This increases the drain-source voltages of the NMOS transistors NN10 and NN11 by the same amount. This can thus provide the stable amplification operation.

As described above, in the illustrative embodiment, the bias circuit 12 includes the transistors of the type corresponding to the transistors in the amplifier 10, so that the predetermined operational characteristics can be implemented even against a certain extent of variations in the device characteristics.

Several modifications described below may be applied to the illustrative embodiment without departing from the spirit of the invention. First, the inductor LD and resistor RA10, which are the load of the amplifier 10, may be replaced by the resistor RA10 alone if a resistive element with a sufficiently small parasitic capacitance, such as an SOS (Silicon On Sapphire) device, is available. This can provide the amplifier with a smaller fabrication space.

The resistor RA10 may have its resistance value Ra10 slightly larger than that determined by the expression (10). When the above-indicated expression (10) holds, the drain-source voltage VDS11 of the NMOS transistor NN11 substantially equals the gate-source voltage VGS11. Assume here that the resistance value Ra10 is increased to value Ra10+$\Delta$R, with the result that the drain-source voltage of the NMOS transistor NN11 changes to value VDS11−$\Delta$V. The NMOS transistor NN11 is then saturated so far as the relation $$\Delta V < Vt \tag{15}$$

is satisfied. Because, taking into account the expression (15) and the relation VGS11=VDS11, the following saturation condition holds:

$$VGS11 - Vt < VDS11 - \Delta V. \tag{16}$$

The expression (15) can be rewritten with the increase $\Delta$R as follows:

$$\Delta V = \Delta R \times Id < Vt. \tag{17}$$

The following expression can thus be obtained with the expression (10) which represents the saturation condition of the NMOS transistor NN11.

$$Rb10/k + Vt/Id \geq Ra10 \geq Rb10/k \tag{18}$$

Within the range of the resistance value Ra10 defined by the expression (18), the resistance Ra10 can be slightly increased to provide a higher gain under the condition of the same current flow and the same supply voltage.

The relation defined by the expression (6) may be changed to read as follows:

$$WB10:WB11:WN10 = 1:m:m \times k. \tag{19}$$

The above discussion still holds for the expression (19). This can decrease such portion of the current flowing through the entire circuitry which flows through the NMOS transistor NB10.

The resistive elements RA10 and RB10 may include an electronic switch for trimming. For example, a plurality of resistive elements may be provided and an MOS transistor may be used to set the optimum connection path in a digital manner to make the circuit more resistant to the device variation, and temperature and voltage variations.

Figure 4:
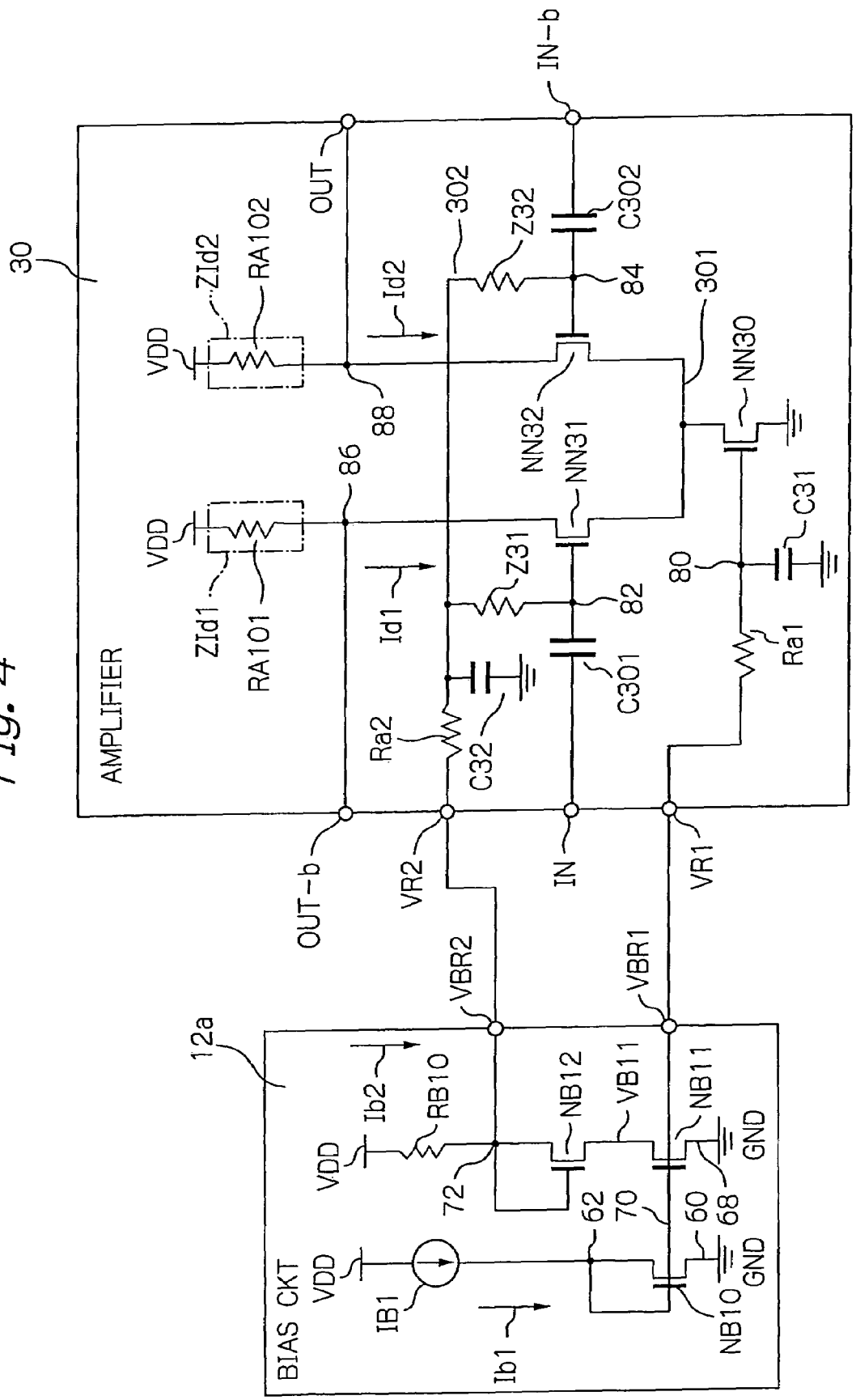
FIG. 4 is a schematic circuit diagram, similar to FIG. 1, showing an alternative embodiment of an amplifier and a bias circuit according to the present invention.

FIG. 4 shows an alternative embodiment of the amplifier and the bias circuit for the amplifier according to the present invention. The circuitry includes a differential type amplifier 30 and the bias circuit 12a, which are interconnected as illustrated. As shown, the bias circuit 12a may be configured to include part of the bias circuit 12 of the illustrative embodiment shown in and described with reference to FIG. 1. The amplifier 30 includes a pair of differential input terminals In and In-b, and a pair of differential output terminals Out and Out-b. The amplifier 30 also includes an NMOS transistor NN30 which serves as a constant-current source, and a pair of NMOS transistors NN31 and NN32. The NMOS transistors NN31 and NN32 have the source electrodes 301 coupled to the drain electrode of the NMOS transistor NN30. Note that this alternative embodiment also preferably includes the switches corresponding to the switches NSW1, NSW2, PSW1 and PSW2 of the previous embodiment, although not specifically shown in the figure. Since their operation is similar to those of the previous embodiment, their description is omitted here for avoiding redundancy.

The NMOS transistor NN30 has its gate electrode 80 grounded via a capacitor C31. The gate electrode 80 also connects to a bias voltage input terminal VR1 via a resistor Ra1. In other words, the gate electrode 80 of the NMOS transistor NN30 which serves as a current source is DC-coupled to the bias voltage input terminal VR1.

The NMOS transistor NN31 has its gate electrode 82 coupled to an input terminal IN via a capacitor C301 which does not pass the DC component. The gate electrode 82 also connects to a node 302 via an impedance element Z31. The NMOS transistor NN32 has its gate electrode 84 coupled to an input terminal IN-b via a capacitor C302 which does not pass a DC component. The gate electrode 84 also connects to the node 302 via an impedance element Z32. The node 302 is grounded via a capacitor C32. The node 302 also connects to the bias voltage input terminal VR2 via a resistor Ra2.

In other words, the gate electrodes 82 and 84 of the pair of the NMOS transistors NN31 and NN32 involved in the amplification operation are respectively AC-coupled to the pair of the differential input terminals In and In-b. Both gate electrodes 82 and 84 are also DC-coupled to the bias voltage input terminal VR2.

As described above, the source electrodes, or node 301, of the pair of the NMOS transistors NN31 and NN32 connect to the drain electrode of the NMOS transistor NN30. The NMOS transistor NN31 has its drain electrode 86 connected to the output terminal OUT-b and a load Zld1. The NMOS transistor NN32 has its drain electrode 88 connected to the output terminal OUT and a load Zld2. Both loads Zld1 and Zld2 connect to the supply voltage VDD.

Assume that the loads Zld1 and Zld2 include DC resistive components RA101 and RA102, respectively, and both of the components RA101 and RA102 have the same resistance value Ra10. Note that the loads Zld1 and Zld2 do not always need an inductor for peaking, as described in regard to the variations of the previous embodiment. Assume here that the loads Zld1 and Zld2 only include the DC resistive elements RA101 and RA102, respectively. In this embodiment, the bias voltage input terminals VR1 and VR2 of the differential type amplifier 30 connect to the bias voltage output terminals VBR1 and VBR2 of the bias circuit 12a, respectively. Note that because the bias circuit 12a may have the same configuration as in the previous embodiment, its description is omitted here.

A description will now be given on the circuit operation. The amplifier 30 will be first described. The amplifier 30 amplifies the AC component of the differential voltage signal given on the input terminal pair IN and IN-b. The circuit then outputs the amplified signal in the form of differential voltage signal across the output terminal pair OUT and Out-b. In order to attain the amplification operation for a signal in the order of giga-hertz, the loads RA101 and RA102 preferably have the resistance value Ra10 thereof equal to a few hundred ohm as in the previous embodiment.

Again, in this circuit 30, in order to provide an appropriate gain, both of the NMOS transistors NN31 and NN32 are preferably biased to operate in its saturated operative region. Also in order to provide an appropriate differential operation, the NMOS transistor NN30 needs to act as a constant-current source. The NMOS transistor NN30 is thus also preferably operative in its saturated region. Again, in this alternative embodiment, the appropriate setting of the device constants as described below allows for the wideband amplification operation even for the low voltage power supply.

The bias circuit 12a has the same values of the current and the device parameters as in the previous embodiment. In the differential type amplifier 30, symbols WN31 and Id1 represent the gate width of the NMOS transistor NN31 and the current flowing through the transistor NN31, respectively, and symbols WN32 and Id2 represent the gate width of the NMOS transistor NN32 and the current flowing through the transistor NN32, respectively. The NMOS transistor NN30 has its gate width WN30. Assume that each transistor has the same gate length L. The gate widths of the NMOS transistors are set as follows, for example:

$$WN31=WN32 \quad (20)$$

$$WB12:WN31=1:k \quad (21)$$

$$WB10:WB11:WN30=1:1:2\times k. \quad (22)$$

When the differential type amplifier 30 receives no signal input, each transistor of the transistor pair develops the same DC voltage. Thus, the DC voltage Vout.dc on the output terminal Out equals the DC voltage Voutb.dc on the output terminal Out-b. Specifically, $$Voutb.dc=Vout.dc. \quad (23)$$

Furthermore, $$Id1=Id2. \quad (24)$$

The value of the currents Id1 and Id2, when equal to each other, is represented by symbol Id. The current Id30 flowing through the transistor NN30 is therefore obtained as follows:

$$Id30=Id1+Id2=2\times Id. \quad (25)$$

Now focus on the NMOS transistors NB10, NB11, and NN30. The transistors NB10 and NB11 can be easily set in its saturated condition, as described above. The current flows Ib1, Ib2 and Id30, then, satisfy the following relationship:

$$Ib1:Ib2:Id30=1:1:2\times k. \quad (26)$$

From the expressions (22) and (26), the NMOS transistors NB10, NB11, and NN30 have the same drain voltage, as in the previous embodiment. This is caused by the three transistors having the same gate voltage, the same drain current ratio, and the same gate width ratio. More specifically, with the symbol V301 representing the voltage at the node 301, the following expression is obtained:

$$VN10=VB11=V301. \quad (27)$$

Taking into account the voltage relation (27) and the fact that the transistors NB10 and NB11 are saturated, it is apparent that the NMOS transistor NN30 is saturated under this condition.

Now focus on the NMOS transistors NB12 and NN31. If the resistances of the resistors RA10 and RB101 are set as $$Rb10:Ra10=k:1, \quad (28)$$

noting that the resistor RB101 has its resistance equal to Rb10 as assumed in paragraph [0070], then, as in the previous embodiment, the drain voltage VBR2 of the NMOS transistor NB12 is as follows:

$$VBR2=VDD-Rb10\times Ib2=VDD-k\times Ra10\times Ib2. \quad (29)$$

The DC component Voutb.dc of the drain voltage of the NMOS transistor NN31 is as follows:

$$Voutb.dc=VDD-Ra10\times Id1=VDD-Ra10\times k\times Ib2=VBR2. \quad (30)$$

Specifically, the DC component of the drain voltage of the NMOS transistor NN31 substantially equals the voltage at the bias voltage output terminal VBR2. Because the gate electrode of the NMOS transistor NN31 is DC-coupled to the bias voltage output terminal VBR2, the NMOS transistor NN31 has its drain-source voltage equal to the gate-source voltage. The transistor NN31 thus operates in its saturation region.

For the MOS transistors NB12 and NN32, the above discussion holds by replacing the voltage and current for the NMOS transistor NN31 with those for the NMOS transistor NN32. The NMOS transistor NN32 thus also operates in its saturation region. Again, in this alternative embodiment, each transistor in the amplifier 30 can have the same node voltage with respect to the DC component as the corresponding transistor in the bias circuit 12a. The result is that each transistor operates in its saturation region, thereby accomplishing the wideband amplifier.

A description will now given on the capability of the circuit in this alternative embodiment to attain the stable amplification operation even at the supply voltage VDD lower than that in the comparative example of FIG. 3. As described above, each node voltage of the NMOS transistor NN30 in the amplifier 30 equals the corresponding node voltage of the NMOS transistor NB11 in the bias circuit 12a. Each node voltage of the NMOS transistors NN31 and NN32 in the amplifier 30 equals the corresponding node voltage of the NMOS transistor NB12 in the bias circuit 12a. If the transistors in the bias circuit 12a are saturated, therefore, the transistors in the amplifier 30 also operate in the saturation region thereof. With respect to the bias circuit 12 of the illustrative embodiment shown in and described with reference to FIG. 1, it is already described that, at the voltage lower than the supply voltage required by the circuit in the comparative example of FIG. 3, the component transistors still operate in the saturation region thereof. For the bias circuit 12a of the alternative embodiment, that is also the case. Namely, the differential type amplifier in the instant alternative embodiment can also perform the amplification operation at the supply voltage lower than that in the comparative example of FIG. 3.

As described above, this alternative embodiment can attain the wideband differential amplification operation even at the supply voltage lower than that in the comparative example of FIG. 3. This embodiment can also provide the stable operation even for some process variations and temperature changes or the like, as in the previous embodiment.

The alternative embodiment may also deduce the same modifications as the previous embodiment. For example, the resistor RA10 may have its resistance Ra10 slightly larger than that defined by the expression (28). In detail, within the range satisfying the following expression:

$$Rb10/k+Vt/Id \geq Ra10 \geq Rb10/k, \quad (31)$$

the resistance of the resistor RA10 may be slightly increased to provide a higher gain under the condition of the same current flow and the same supply voltage.

The relation determined by the expression (26) may be changed as follows:

$$WB10:WB11:WN30=1:m:2 \times m \times k. \quad (32)$$

This can decrease such portion of the current flowing through the entire circuit that flows through the NMOS transistor NB10. The gate width WN30 of the NMOS transistor NN30 may be smaller than that determined by the expressions (26) and (32) so far as the transistor NN30 is not brought into its non-saturated region. This can increase the impedance serving as the current source, thereby decreasing the AC loss during the differential amplification operation.

The resistive elements RA10 and RB10 may include an electronic switch for trimming. For example, a plurality of resistive elements may be provided and an MOS transistor may be used to set the optimum connection path in a digital manner to make the circuit more resistant to the device variation, and temperature and voltage variations.

The entire disclosure of Japanese patent application No. 2005-85157 filed on Mar. 24, 2005, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A bias circuit for an amplifier for providing a bias voltage to the amplifier comprising a ground, a first transistor, a second transistor, a first resistive load, and a first supply voltage, which are connected in series in this order, wherein
   in the amplifier, a first bias voltage is provided to a gate electrode or a base of the first transistor, and a second bias voltage is provided to a gate electrode or a base of the second transistor,
   said bias circuit comprising:
   a third transistor having a gate electrode and a drain electrode, or a collector and a base, diode-connected, the drain electrode or collector of said third transistor providing the first bias voltage of the amplifier; and
   a fourth transistor, a fifth transistor and a second resistive load which are connected in series in this order, said first resistive load being connected to a second supply voltage, said fourth transistor having a gate electrode or a base connected to a drain electrode or a collector of said third transistor, said fifth transistor having a gate electrode and a drain electrode, or a base and a collector, diode-connected, the drain electrode or collector of said fifth transistor providing the second bias voltage;
   wherein, with said second resistive load having resistance Rb and conducting a direct current Ib therethrough, and the first resistive load having resistance Ra and conducting a direct current therethrough equal to k×Ib, the resistance Ra is substantially equal to or more than Rb×(1/k), wherein k is a constant.

2. The bias circuit according to claim 1, wherein the amplifier is of a single-end type.

3. A bias circuit for a differential type amplifier for providing a bias voltage to the amplifier comprising a ground, a first transistor, a pair of second transistors, a pair of first resistive loads and a first supply voltage, which are connected in series in this order, wherein
   one of the second transistors are connected in series to one of the first resistive loads, the other of the second transistors being connected in series to the other of the first resistive loads, each of the second transistors having a source electrode or an emitter connected to the first transistor,
   the first transistor having a gate electrode or a base supplied with a first bias voltage, each of the second transistors having a gate electrode or a base supplied with a second bias voltage,
   said bias circuit comprising:
   a third transistor having a gate electrode and a drain electrode, or a collector and a base, diode-connected, the drain electrode or collector of said third transistor providing the first bias voltage of the differential type amplifier,
   a fourth transistor, a fifth transistor and a second resistive load which are connected in series in this order, said second resistive load being connected to the first supply voltage, said fourth transistor having a gate electrode or a base connected to a drain electrode or a collector of said third transistor, said fifth transistor having a gate electrode and a drain electrode, or a base and a collector, diode-connected, the drain electrode or collector of said fifth transistor providing the second bias voltage.

4. The bias circuit according to claim 3, wherein, with said second resistive load having resistance Rb and conducting a direct current Ib therethrough, and the first resistive load having resistance Ra and conducting a direct current therethrough equal to k×Ib, the resistance Ra is substantially equal to or more than Rb×(1/k), wherein k is a constant.

* * * * *